United States Patent
Yu et al.

(10) Patent No.: US 6,373,875 B1
(45) Date of Patent: Apr. 16, 2002

(54) SEMICONDUCTOR LASER STRUCTURE WITH AN INCREASED CATASTROPHIC OPTICAL DAMAGE LEVEL

(75) Inventors: Yuan-Chen Yu, Hsinchu; Chien-Chia Chiu; Jin-Kuo Ho, both of Taipei, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/383,757

(22) Filed: Aug. 26, 1999

(30) Foreign Application Priority Data

Jul. 19, 1999 (TW) .......................................... 88112205

(51) Int. Cl.$^7$ ................................................ H01S 5/00
(52) U.S. Cl. .......................................... 372/46; 372/45
(58) Field of Search ................................... 372/45; 1/45

(56) References Cited

U.S. PATENT DOCUMENTS

| | | | |
|---|---|---|---|
| 4,282,494 A | * 8/1981 | Yonezu et al. | 372/46 |
| 4,964,135 A | * 10/1990 | Mitsui et al. | 372/46 |
| 5,151,913 A | * 9/1992 | Ueno | 372/46 |
| 5,737,351 A | * 4/1998 | Ono | 372/45 |
| 5,781,577 A | * 7/1998 | Nagai et al. | 372/46 |

FOREIGN PATENT DOCUMENTS

| | | | |
|---|---|---|---|
| JP | 09-018082 A | * 1/1997 | H01S/3/18 |
| JP | 10-163563 A | * 6/1998 | H01S/3/18 |

\* cited by examiner

*Primary Examiner*—Quyen Leung
(74) *Attorney, Agent, or Firm*—J. C. Patents (57) ABSTRACT

A semiconductor laser structure is provided, which has an increased catastrophic optical damage (COD) level that allows the laser diode to have an increased life time of use. This semiconductor laser structure is characterized in the forming of a current-blocking structure proximate to the facets of the laser diode, which can help reduce the injected current into the facets, thereby increasing the COD level of the resulted laser diode. As a result, the resulted laser diode can operate at a high output power and nonetheless have an increased life time of use. Moreover, the forming of the current-blocking layers proximate to the facets can be performed simply by incorporating an additional photomask step in the fabrication without having equipment such as epitaxial equipment or vacuum equipment in the case of the prior art.

14 Claims, 6 Drawing Sheets

SEMICONDUCTOR LASER STRUCTURE WITH AN INCREASED CATASTROPHIC OPTICAL DAMAGE LEVEL

CROSS-REFERENCE TO RELATED APPLICATION

This application claims the priority benefit of Taiwan application serial no. 88112205, filed Jul. 19, 1999, the full disclosure of which is incorporated herein by reference.

BACKGROUND OF THE INVENTION

1. Field of the Invention

This invention relates to semiconductor laser technology, and more particularly, to a semiconductor laser structure, customarily referred to as a laser diode, with an increased catastrophic optical damage (COD) level that allows the laser diode to have an increased life time of use.

2. Description of Related Art

A laser diode is a semiconductor laser device that can produce stimulated emission of coherent light at a PN junction when an electric voltage is being applied thereto. Fundamentally, a laser diode is composed of a P-type layer, an N-type layer, and an active layer sandwiched between the P-type layer and the N-type layer. Conventionally, these three layers are all formed through the MOCVD (Metal Organic Chemical-Vapor Deposition) technology. The laser diode has one end coupled to a non-output facet, which is coated with a high-reflective dielectric material, and the opposite end coupled to an output facet, which is coated with a low-reflective dielectric material. When an electric voltage is being applied to the laser diode, the induced current will be injected into the active layer, thereby causing stimulated emission of coherent light from the active layer. The produced coherent light then oscillates between the two facets to gain power and, until reaching a certain power level, penetrates through the output facet to the outside of the laser diode, resulting in a laser beam from the laser diode.

Figure 6:
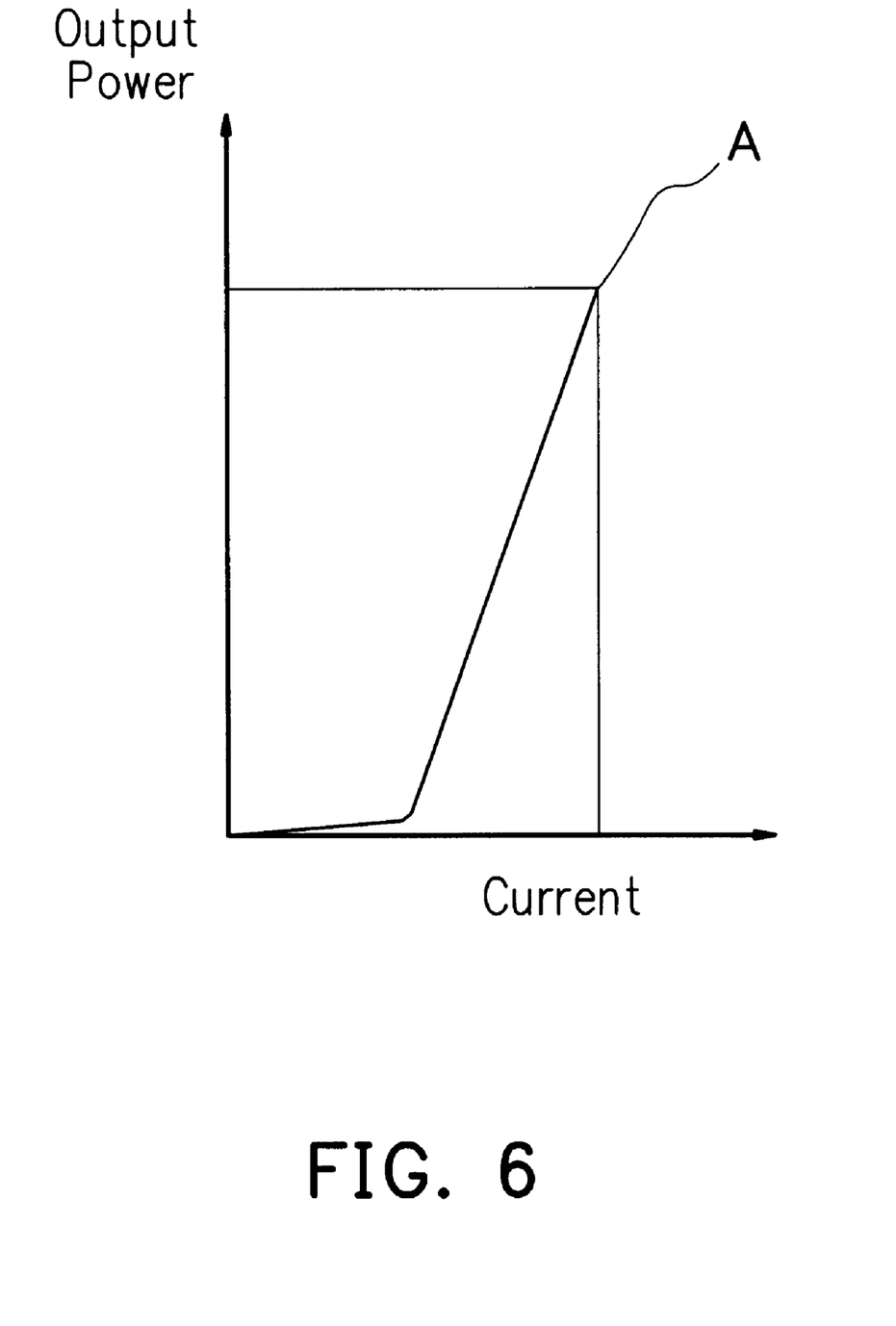
FIG. 6 is a graph, showing the output characteristic of a laser diode.

FIG. 6 is a graph, showing the output characteristic (output laser power versus injected current) of a conventional laser diode. When the output power reaches a certain level, commonly referred to as the catastraphic optical damage (COD) point, as indicated by the letter A in FIG. 6, it would cause melting to the facets, thus damaging the laser diode. Moreover, when the laser diode operates continuously for a long period at a high level of output power, for example at 30 mW (milliwatt), it can also easily cause damage to the facets. There exists, therefore, a need in the industry for a new semiconductor laser structure that allows the laser diode to withstand a higher COD level so as to make the laser operation more reliable and enduring.

Solutions to the foregoing problem include the use of a facet coating of high reflectivity and improvement on the window structure of the laser diode. These solutions, however, require the use of epitaxial technology and advanced coating technology to achieve, and therefore are quite complex and costly to implement.

Related patents includes U.S. Pat. No. 5,812,580 to Nabiev, Rachit F. et al; U.S. Pat. No. 5,469,457 to Nagai, Yutaka et al; U.S. Pat. No. 5,491,711 to Mand, Ranjit S. et al; and U.S. Pat. No. 4,964,135 to Shigeru Mitsui et al; to name a few.

The U.S. Pat. No. 5,812,580 to Nabiev, Rachit F. et al can increase the laser output power without causing COD through the use of a multi-layer coating of highly reflective dielectrics. One drawback to this patent, however, is that the fabrication process is quite complex and is thus quite time-consuming to implement. Moreover, it requires the use of expensive vacuum equipment to perform, which makes the fabrication quite costly to implement.

The U.S. Pat. No. 5,469,457 to Nagai, Yutaka et al can prevent the occurrence of COD by implanting impurity ions into the quantum well in the laser diode to thereby alter the window structure into a disordered state. One drawback to this patent, however, is that it require the use of epitaxial technology to achieve, and is therefore quite complex in process and costly to implement.

The U.S. Pat. No. 5,491,711 to Mand, Ranjit S. et al can increase the COD level by first coating aluminum or phosphorus on the facets and then performing a heat treatment process to cause the aluminum or phosphorus atoms to diffuse into the active layer. One drawback to this patent, however, is that it require the use of epitaxial technology to achieve, and is therefore quite complex in process and costly to implement.

The U.S. Pat. No. 4,964,135 to Shigeru Mitsui et al can increase the COD level through a first step of forming a ridge mesa over a P-type cladding layer, a second step of forming an N-type GaAs layer serving as a current-blocking structure, and a third step of forming a P-type GaAs layer serving as a contact layer. The N-type GaAs current blocking structure can help reduce the amount of injected current into the active layer, thereby increasing the COD level. One drawback to this patent, however, is that the resulted COD level is still unsatisfactory.

SUMMARY OF THE INVENTION

The invention provides a novel semiconductor laser structure. The invention has three preferred embodiments.

According to the first preferred embodiment, the semiconductor laser structure of the invention includes: (a) a semiconductor substrate of first conductive type;(b)a first cladding layer of first conductive type formed over the substrate,(c)an active layer formed over the cladding layer of first conductive type (d) a pair of facets including a first facet and a second facet disposed in parallel; (e) a second cladding layer of second conductive type formed over the substrate, the second cladding layer having a flat part and a ridge mesa over the flat part and extending from the first facet to the second facet; (f) a contact layer of second conductive type formed over the ridge mesa of the second cladding layer; (g) a first current-blocking layer formed over a first end part of the contact layer proximate to the first facet; (h) a second current-blocking layer formed over a second end part of the contact layer proximate to the second facet; and (i) a third current-blocking layer formed over the flat part of the cladding layer, the third current-blocking layer being lower in elevation than the first and second current-blocking layers over the ridge mesa.

According to the second preferred embodiment, the semiconductor laser structure of the invention includes: (a) a semiconductor substrate of first conductive type ;(b)a first cladding layer of first conductive type formed over the substrate,(c) an active layer formed over the first cladding layer of first conductive type (d) a pair of facets including a first facet and a second facet disposed in parallel; (e) a second cladding layer of second conductive type formed over the substrate, the second cladding layer having a flat part and a ridge mesa over the flat part and extending from the first facet to the second facet; (f) a contact layer of second conductive type formed over a middle portion of the ridge mesa of the cladding layer; (g) a first current-blocking layer formed over a first end part of the contact layer proximate to the first facet and neighboring the contact layer; (h) a second current-blocking layer formed over a second end part of the contact layer proximate to the second facet and neighboring the contact layer; and (i) a third current-blocking layer formed over the flat part of the second cladding layer.

According to the third preferred embodiment, the semiconductor laser structure of the invention includes: (a) a semiconductor substrate of first conductive type ; (b) a first cladding layer of first conductive type formed over the substrate, (c) an active layer formed over the first cladding layer of first conductive type (d) a pair of facets including a first facet and a second facet disposed in parallel; (e) a second cladding layer of second conductive type formed over the substrate, the second cladding layer having a flat part and a ridge mesa over the flat part and extending from the first facet to the second facet; (f) a contact layer of second conductive type formed over a middle portion of the ridge mesa of the cladding layer, the contact layer having a first end side parallel to the first facet and separated from the first facet by a first predetermined distance and a second end side parallel to the second facet and separated from the second facet by a second predetermined distance; and (g) a current-blocking layer formed over the flat part of the second cladding layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, three preferred embodiments are disclosed in the following, respectively with reference to FIGS. 1A–1B, FIGS. 2A–2B, and FIGS. 3A–3B.

First Preferred Embodiment

Figure 1A:
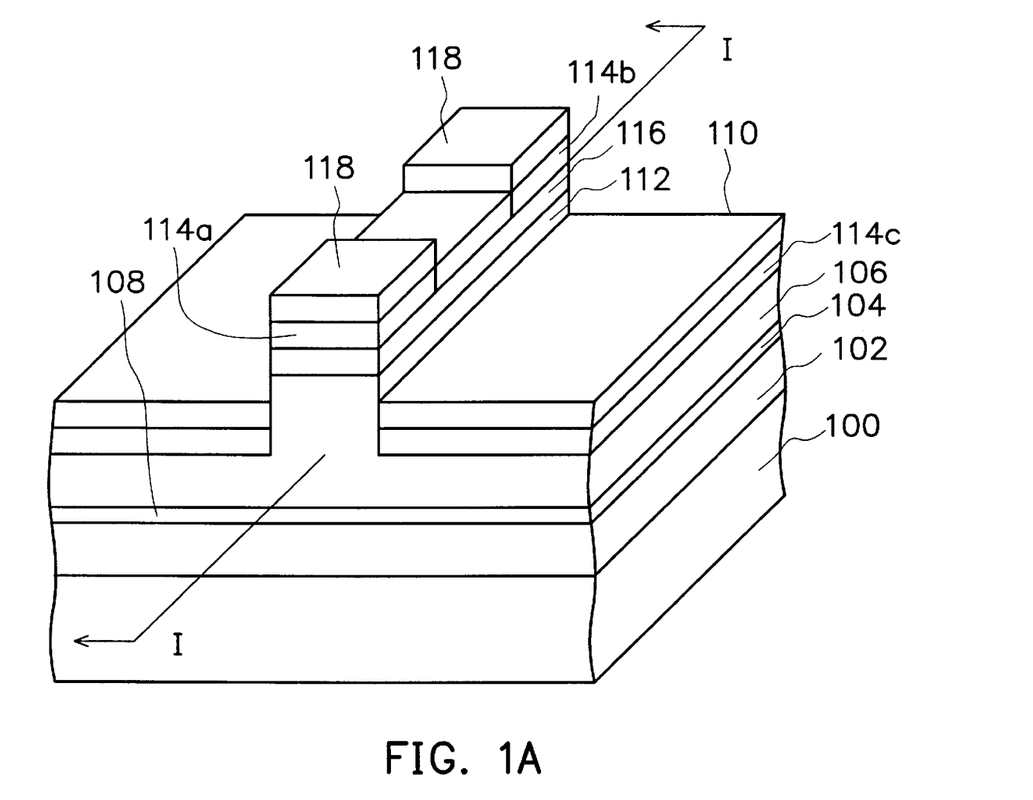
FIG. 1A is a schematic perspective diagram of a first preferred embodiment of the semiconductor laser structure according to the invention.
Figure 1B:
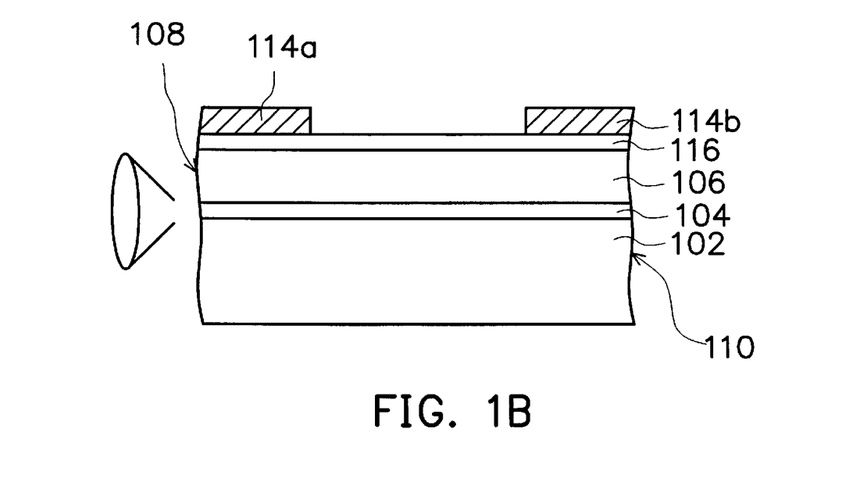
FIG. 1B is a schematic sectional diagram of the semiconductor laser structure of FIG. 1A cutting through the line I—I.

A first preferred embodiment of the semiconductor laser structure of the invention is disclosed in this subsection with reference to FIGS. 1A–1B, wherein FIG. 1A shows a schematic perspective view of the semiconductor laser structure of this embodiment; and FIG. 1B shows a schematic sectional view of the semiconductor laser structure of FIG. 1A cutting through the line I—I.

Referring to FIG. 1A together with FIG. 1B, the semiconductor laser structure of the first preferred embodiment includes a semiconductor substrate 100, a first cladding layer 102 over the substrate 100, an active layer 104 over the first cladding layer 102, and a second cladding layer 106 over the active layer 104. The first cladding layer 102 is identical in conductive type to the substrate 100 but opposite to the second cladding layer 106. For example, in the case of the substrate 100 being P-type, the first cladding layer 102 is P-type while the second cladding layer 106 is N-type; and in the case of the substrate 100 being N-type, the first cladding layer 102 is N-type while the second cladding layer 106 is P-type. Moreover, the semiconductor laser structure includes a first facet 108 disposed transversely at one end thereof and a second facet 110 disposed in parallel to the first facet 108 at the opposite end.

The second cladding layer 106 includes a flat part laid over the active layer 104 and a ridge mesa 112 protruding from the middle of the flat part and extending longitudinally over the flat part from the first facet 108 to the second facet 110. This ridge mesa 112 can be formed, for example, through a photolithographic and etching process to etch away selected portions of the originally deposited layer of the second cladding layer 106.

Further, a contact layer 116 is formed over the entire top surface of the ridge mesa 112 from a semiconductor material of opposite conductive type to the substrate 100 and the same conductive type as the second cladding layer 106, such as p type GaAs.

It is a characteristic feature of the invention that a plurality of current-blocking layers are formed in the semiconductor laser structure, including a first current-blocking layer 114a over a first end part of the contact layer 116 proximate to the first facet 108, a second current-blocking layer 114b over a second end part of the contact layer 116 proximate to the second facet 110, and a third current-blocking layer 114c over the flat part of the second cladding layer 106. The first and second current-blocking layers 114a, 114b are separated from each other, and are higher in elevation than the third current-blocking layer 114c. These three current-blocking layers 114a, 114b, 114c are formed from an insulating material, such as silicon nitride ($SiN_x$), or silicon dioxide ($SiO_2$), or titanium dioxide ($TiO_2$), or aluminum oxide ($Al_2O_3$) through the following processes. First, a first photoresist layer (not shown) is formed as a mask over the contact layer 116, and then a PECVD (plasma-enhance chemical-vapor deposition) process is performed to deposit the selected insulating material over the unmasked part of the second cladding layer 106, thereby forming the third current-blocking layer 114c. After this, the first photoresist layer is removed. Subsequently, a second photoresist layer (not shown) is formed in such a manner as to mask all the areas other than the those two parts of the contact layer 116 proximate to the first and second facets 108, 110, and then a PECVD process is performed to deposit the selected insulating material over the unmasked portions of the contact layer 116, thereby forming the first and second current-blocking layers 114a, 114b. These three current-blocking layers 114a, 114b, 114c are formed to a thickness of from 10 Å to 100,000 Å (angstrom).

Further, a plurality of metallization layers 118 are formed, respectively over the first and second current-blocking layers 114a, 114b, over the exposed surface of the contact layer 116 between the first and second current-blocking layers 114a, 114b, and over the third current-blocking layer 114c. These metallization layers 118 are opposite in conductive type to the substrate 100, and are used to serve as the electrodes of the resultant laser diode.

As shown in FIG. 1B, the first and second current-blocking layers 114a, 114b are higher in top surface than the contact layer 116. For this reason, the semiconductor laser structure of this embodiment is referred to as a protruded-type laser diode.

When an electric voltage is being applied to the electrodes of the semiconductor laser structure, the induced current will penetrate through the second cladding layer 106 and subsequently enter into the active layer 104. Due to the provision of the first and second current-blocking layers 114a, 114b respectively proximate to the first and second facts 108, 110, the induced current is prevented from entering into the first and second facets 108, 110, thereby increasing the COD level. As a result, the semiconductor laser structure can withstand a high output power and operate reliably for a longer life time of use than the prior art.

It is an advantage of the invention that the forming of the first and second current-blocking layers 114a, 114b requires only a modification to photomask without having to use additional semiconductor fabrication equipment as in the case of the prior art. The invention is therefore more advantageous to utilize than the prior art.

Second Preferred Embodiment

Figure 2A:
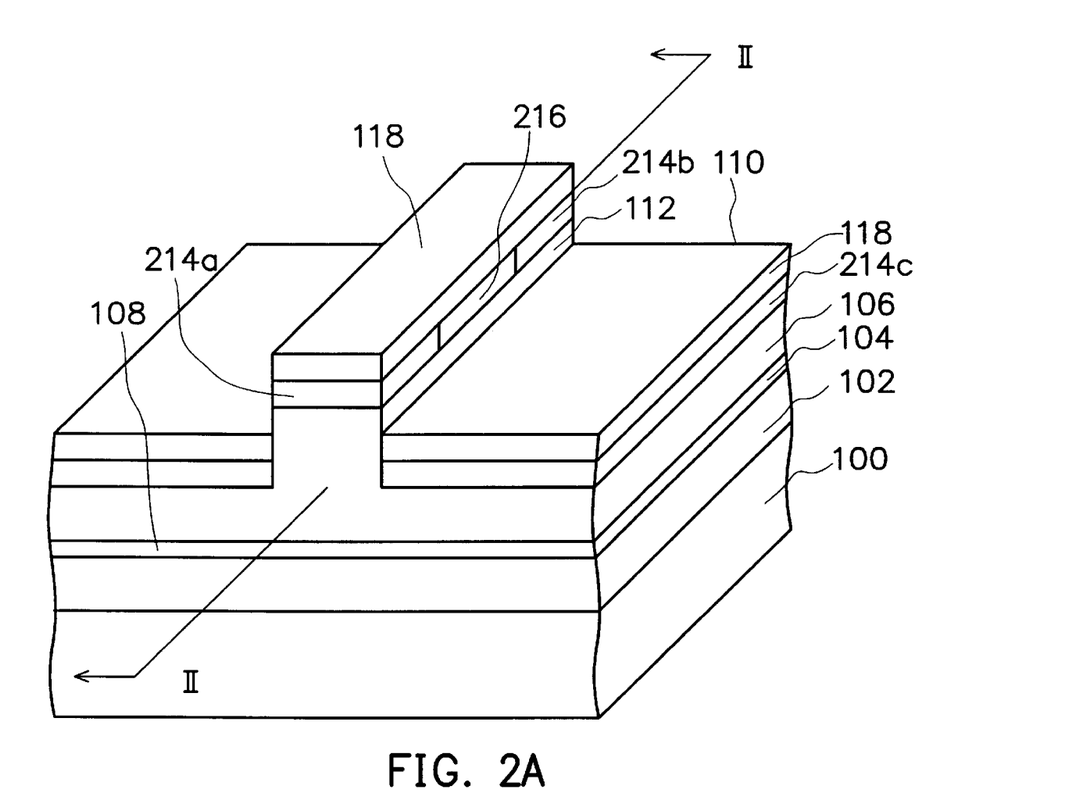
FIG. 2A is a schematic perspective diagram of a second preferred embodiment of the semiconductor laser structure according to the invention.
Figure 2B:
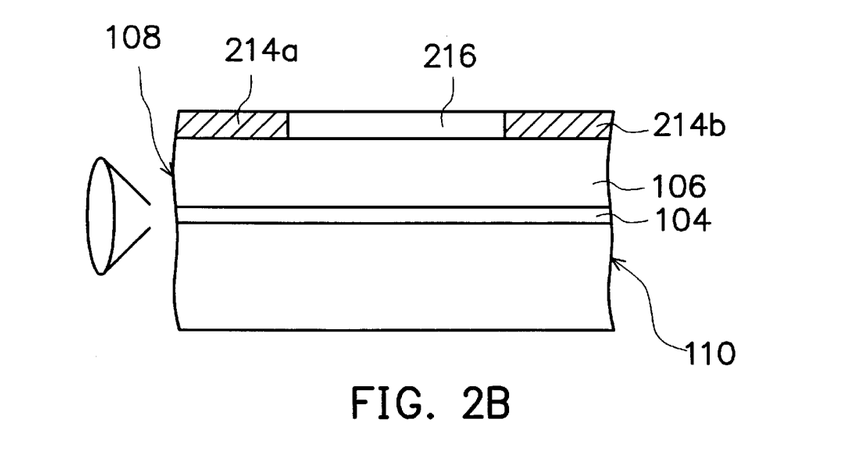
FIG. 2B is a schematic sectional diagram of the semiconductor laser structure of FIG. 2A cutting through the line II—II;7

A second preferred embodiment of the semiconductor laser structure of the invention is disclosed in this subsection with reference to FIGS. 2A-2B, wherein FIG. 2A shows a schematic perspective view of the semiconductor laser structure of this embodiment; and FIG. 2B shows a schematic sectional view of the semiconductor laser structure of FIG. 2A cutting through the line II—II. In FIGS. 2A–2B, those components that are identical in structure and function as those in the previous embodiment of FIGS. 1A–1B are labeled with the same reference numerals.

Referring to FIG. 2A together with FIG. 2B, the semiconductor laser structure of this embodiment includes a semiconductor substrate 100, a first cladding layer 102, an active layer 104, and a second cladding layer 106. Moreover, the semiconductor laser structure includes a first facet 108 disposed transversely at one end thereof and a second facet 110 disposed in parallel to the first facet 108 at the opposite end. The second cladding layer 106 includes a flat part laid over the active layer 104 and a ridge mesa 112 protruding from the middle of the flat part and extending longitudinally over the flat part from the first facet 108 to the second facet 110. These components are all identical in structure and function as those in the previous embodiment of FIGS. 1A–1B, so that detailed description thereof will not be herein repeated.

Further, a contact layer 216 is formed over the ridge mesa 112 from a semiconductor material of opposite conductive type to the substrate 100 and the same conductive type as the second cladding layer 106. This embodiment differs from the previous one particularly in that the contact layer 216 here is formed only over the middle part of the ridge mesa 112 and not over the two opposite parts proximate to the first and second facets 108, 110. This contact layer 216 can be formed through photolithographic and etching process to remove the two opposite parts of the contact layer proximate to the first and second facets 108, 110, with the remaining p-GaAs serving as the intended contact layer 216.

It is a characteristic feature of the invention that a plurality of current-blocking layers are formed in the semiconductor laser structure, including a first current-blocking layer 214a over a first end part of the ridge mesa 112 proximate to the first facet 108 and neighboring the contact layer 216, a second current-blocking layer 214b over a second end part of the contact layer 116 proximate to the second facet 110 and neighboring the contact layer 216, and a third current-blocking layer 214c over the flat part of the second cladding layer 106. The first and second current-blocking layers 214a, 214b are separated from each other by the contact layer 216 and leveled in top surface to the contact layer 216. These three current-blocking layers 214a, 214b, 214c are formed from an insulating material, such as silicon nitride ($SiN_x$), or silicon dioxide ($SiO_2$), or titanium dioxide ($TiO_2$), or aluminum oxide ($Al_2O_3$) through the following process. First, a photoresist layer (not shown) is formed in such a manner as to mask the contact layer 216, and then a PECVD process is performed to deposit the selected insulating material over all the unmasked portions, thereby forming the current-blocking layers 214a, 214b, 214c. After this, the photoresist layer is removed. These three current-blocking layers 214a, 214b, 214c are deposited to a thickness of from 10 Å to 100,000 Å (angstrom).

Further, a plurality of metal-layers 118 are formed, respectively over the first and second current-blocking layers 214a, 214b, over the contact layer 216 between the first and second current-blocking layers 214a, 214b, and over the third current-blocking layer 214c. These metal layers 118 are opposite in conductive type to the substrate 100, and are used to serve as the electrodes of the resultant laser diode.

As shown in FIG. 2B, the first and second current-blocking layers 114a, 114b are leveled in top surface to the contact layer 216. For this reason, the semiconductor laser structure of this embodiment is referred to as a leveled-type laser diode.

When an electric voltage is being applied to the electrodes of the semiconductor laser structure, the induced current will penetrate through the second cladding layer 106 and subsequently enter into the active layer 104. Due to the provision of the first and second current-blocking layers 214a, 214b respectively proximate to the first and second facets 108, 110, the induced current is prevented from entering into the first and second facets 108, 110, thereby increasing the COD level. As a result, the semiconductor laser structure can withstand a high output power and operate reliably for a longer life -time of use than the prior art.

Third Preferred Embodiment

Figure 3A:
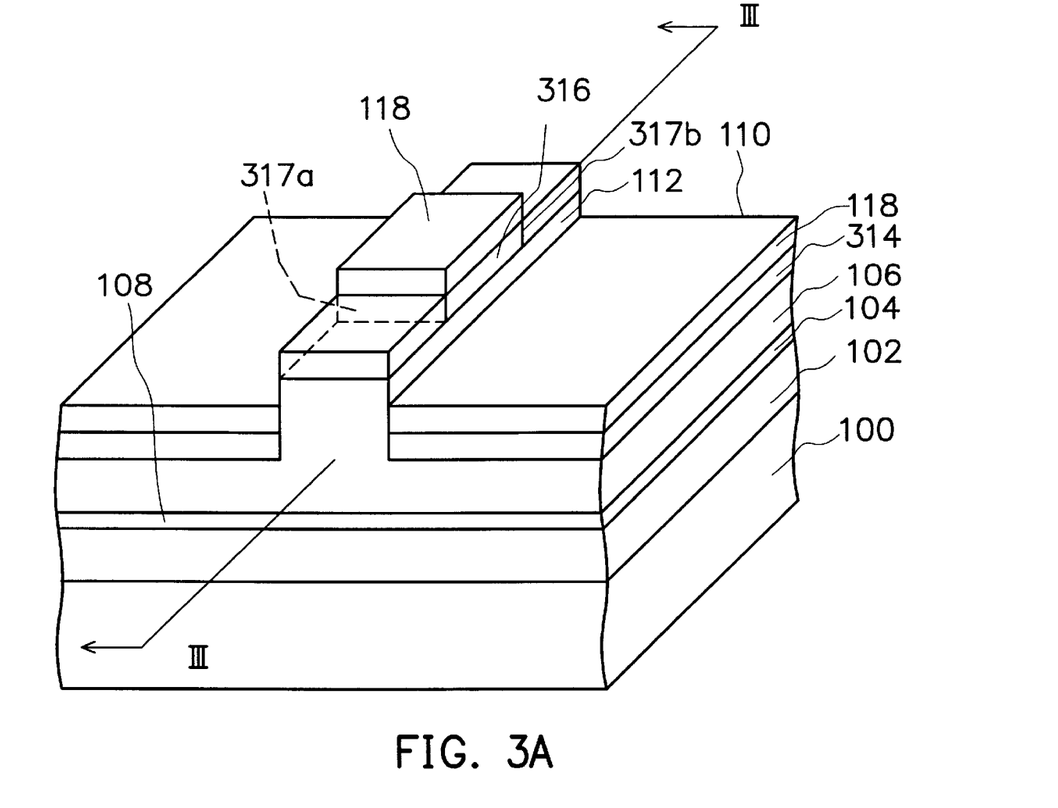
FIG. 3A is a schematic perspective diagram of a third preferred embodiment of the semiconductor laser structure according to the invention.
Figure 3B:
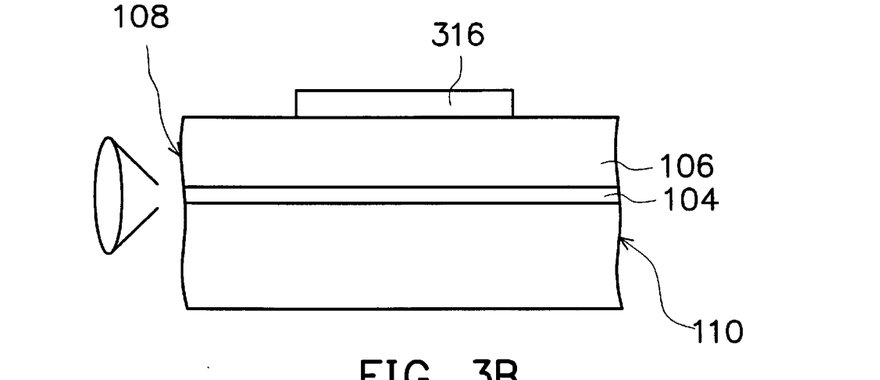
FIG. 3B is a schematic sectional diagram of the semiconductor laser structure of FIG. 3 cutting through the line III—III.

A third preferred embodiment of the semiconductor laser structure of the invention is disclosed in this subsection with reference to FIGS. 3A–3B, wherein FIG. 3A shows a schematic perspective view of the semiconductor laser structure of this embodiment; and FIG. 3B shows a schematic sectional view of the semiconductor laser structure of FIG. 3A cutting through the line III—III. In FIGS. 3A–3B, those components that are identical in structure and function as those in the previous embodiments of FIGS. 1A–1B and FIGS. 2A–2B are labeled with the same reference numerals.

Referring to FIG. 3A together with FIG. 3B, the semiconductor laser structure of this embodiment includes a semiconductor substrate 100, a first cladding layer 102, an active layer 104, and a second cladding layer 106. Moreover, the semiconductor laser structure includes a first facet 108 disposed transversely at one end thereof and a second facet 110 disposed in parallel to the first facet 108 at the opposite end. The second cladding layer 106 includes a flat part laid over the active layer 104 and a ridge mesa 112 protruding from the middle of the flat part and extending longitudinally over the flat part from the first facet 108 to the second facet 110. These components are all identical in structure and function as those in the previous embodiments of FIGS. 1A–1B and FIGS. 2A–2B, so that detailed description thereof will not be herein repeated.

Further, a contact layer 316 is formed over the ridge mesa 112 from a semiconductor material of opposite conductive type to the substrate 100, such as p type GaAs. In this embodiment, the contact layer 316 is formed substantially in the same manner as the second embodiment, i.e., the contact layer 316 is formed only over the middle part of the ridge mesa 112 and not over the two opposite parts proximate to the first and second facets 108, 110. The contact layer 316 has a first end side 317a parallel to the first facet 108 and separated from the same by a first predetermined distance, and a second end side 317b parallel to the second facet 110 and separated from the same by a second predetermined distance. This contact layer 316 can be formed by photolithographic and etching process to remove the two opposite parts of the deposited p-GaAs proximate to the first and second facets 108, 110, with the remaining GaAs serving as the intended contact layer 316.

It is a characteristic feature of the invention that a current-blocking layer 314 is formed over the flat part of the second cladding layer 106. This embodiment differs from the previous two particularly in that there are no current-blocking layers formed over the ridge mesa 112. The current-blocking layer 314 is formed from an insulating material, such as silicon nitride ($SiN_x$), or silicon dioxide ($SiO_2$), or titanium dioxide ($TiO_2$), or aluminum oxide ($Al_2O_3$) through the following process. First, a photoresist layer (not shown) is formed in such a manner as to mask the contact layer 316, and then a PECVD process is performed to deposit the selected insulating material over all the unmasked portions, thereby forming the current-blocking layer 314 over the flat portions of the second cladding layer 106. After this, the photoresist layer is removed. The current-blocking layer 314 is deposited to a thickness of from 10 Å to 100,000 Å (angstrom).

In this embodiment, although there are no insulating layers formed over the ridge mesa 112, the induced current from the applied voltage would still be partly prevented from entering the first and second facets 108, 110 due to the existence of the ridge mesa 112. The resultant current-blocking effect, however, would be inferior to the foregoing two embodiments where current-blocking layers are formed over the ridge mesa 112.

Further, a plurality of metal-layers 118 are formed, respectively over the contact layer 316, over the exposed surfaces of the ridge mesa 112, and over the current-blocking layer 314. These metal-layers 118 are opposite in conductive type to the substrate 100, and are used to serve as the electrodes of the resultant laser diode.

As shown in FIG. 3B, in this embodiment, there are no current-blocking layers formed over the second cladding layer 106 proximate to the first and second facets 108, 110 as contrary to the case of the prior art, resulting in two recessed portions in the semiconductor laser structure. For this reason, the semiconductor laser structure of this embodiment is referred to as a recessed-type laser diode.

Comparison with Prior Art

Figure 4:
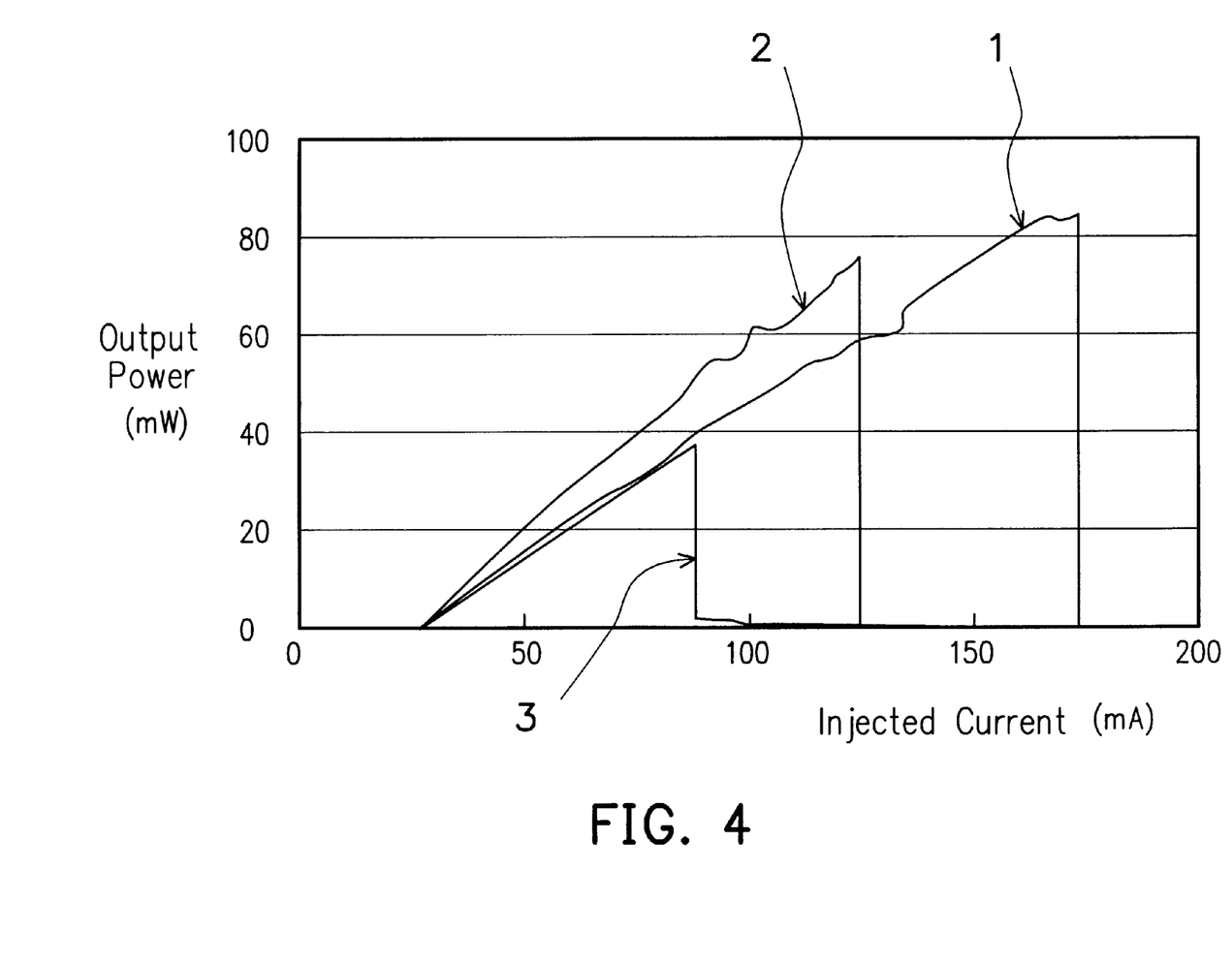
FIG. 4 is a graph, showing the output characteristic of the invention in comparison with the output characteristic of the prior art.

FIG. 4 is a graph showing the output characteristic (output laser power versus injected current) of the invention in comparison with the output characteristic of two conventional types of laser diodes. In this graph, the curve designated by the reference numeral represents the output characteristic of the invention; the curve designated by the reference numeral 2 represents the output characteristic of a first conventional type of laser diode having facet coating; and the curve designated by the reference numeral 3 represents the output characteristic of a second conventional type of laser diode having no current-blocking structure and no facet coating. It can be seen from this graph that the COD level of the invention is better than the first conventional type of laser diode having facet coating, and is greatly better than the second conventional type of laser diode having no current-blocking structure and no facet coating.

Figure 5:
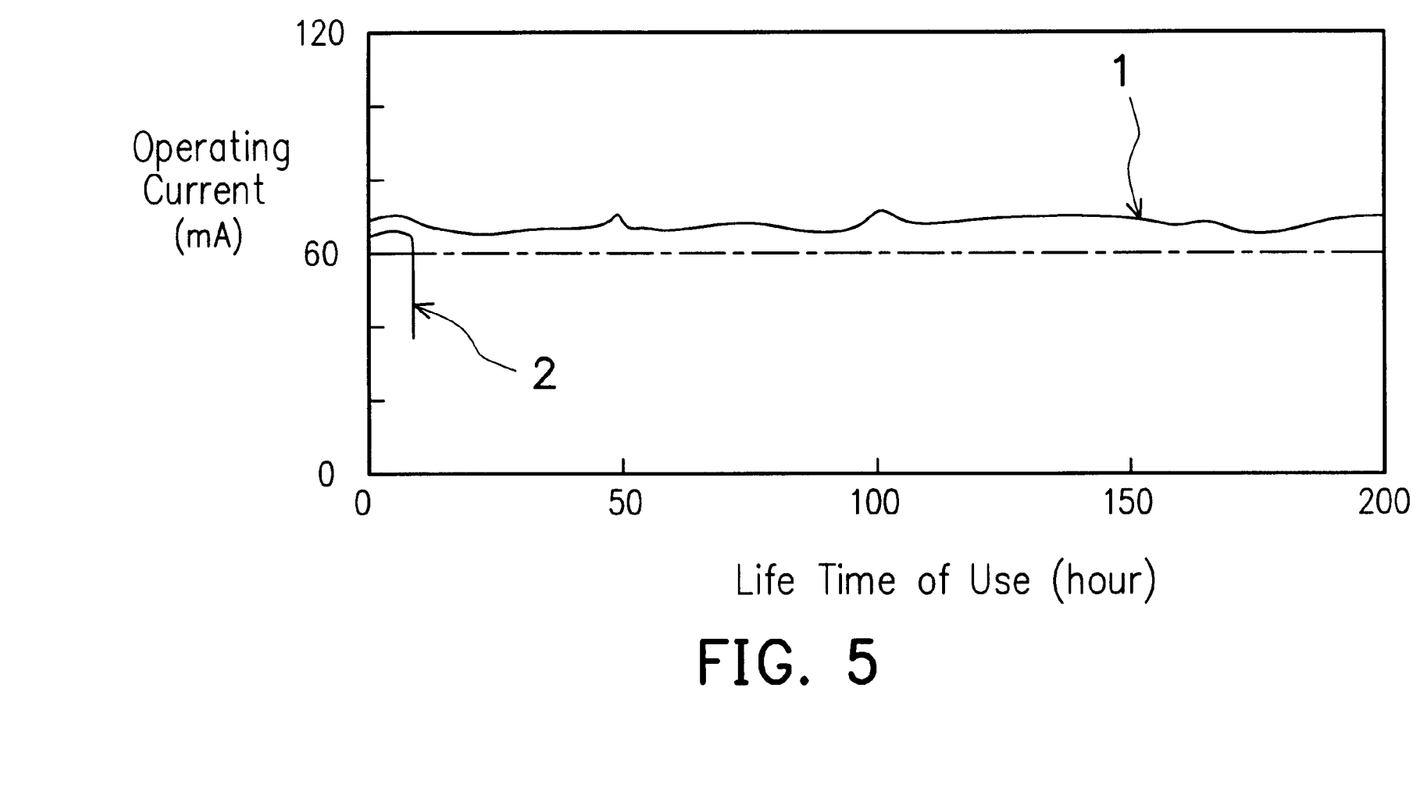
FIG. 5 is a graph, showing the life time of use of the invention in comparison with the life time of use of the prior art.

Further, FIG. 5 is a graph showing the life time of use of the invention in comparison with the life time of use of the prior art. In this test, a burn-in test is performed to the laser diode of the invention and a conventional type of laser diode having the same facet coating as the invention except having no current-blocking structures. In this graph, the curve designated by the reference numeral 1 represents the life time of use of the invention; while the curve designated by the reference numeral 2 represents the lift time of use of the conventional type of laser diode in comparison. It can be seen from this graph that the invention is still operable after being operated continuously for a period of about 200 hours; whereas, the conventional type of laser diode in comparison would be operable for only a continuous period of about 10 hours.

From the foregoing test results, it can be learned that the invention can help increase the COD level of the resulted laser diode, allowing the laser diode to operate at a high output power and nonetheless have an increased life time of use.

Conclusion

In conclusion, the invention provides a new semiconductor laser structure which has the following advantages over the prior art.

First, the invention utilizes the forming of a current-blocking structure over the flat part of the second cladding layer and over two opposite end parts of the ridge mesa proximate to the two facets, which can help reduce the injected current into the facets, thereby increasing the COD level of the resulted laser diode.

As a result, the laser diode of the invention can operate at a high output power and nonetheless have an increased life time of use. The invention is therefore more reliable and endurable to use than the prior art.

Moreover, the forming of the current-blocking layers proximate to the facets can be performed simply by incorporating an additional photomask step in the fabrication without having to use additional fabrication equipment such as epitaxial equipment or vacuum equipment in the case of the prior art. The use of the invention is therefore more cost-effective than the prior art.

The invention has been described using exemplary preferred embodiments. However, it is to be understood that the scope of the invention is not limited to the disclosed embodi-

What is claimed is:

1. A semiconductor laser structure, which comprises:
   a semiconductor substrate of first conductive type, comprising a pair of principal side surfaces including a first surface and a second surface, wherein the first surface and the second surface are disposed opposite and parallel to each other;
   a first cladding layer of first conductive type formed over the substrate, the first cladding layer extending from the first surface to the second surface;
   an active layer formed over the first cladding layer of first conductive type over, the active layer extending from the first surface to the second surface;
   a second cladding layer of second conductive type formed over the active layer, the second cladding layer having a flat part and a ridge mesa over the flat part, and the second. cladding layer extending from the first surface to the second surface, wherein the ridge mesa includes a length portion which is longer than a width portion, the length portion extends from the first surface to the second surface;
   the side surfaces including the side surfaces of the first cladding layer, the active layer, and the flat surface of the second cladding layer, along the first surface and the second surface serves as a first facet and a second facet of the semiconductor laser structure respectively;
   a contact layer of second conductive type formed over the ridge over the ridge mesa of the second cladding layer;
   a first current blocking layer formed over a first end part of the contact layer proximate to the first facet;
   a second current blocking layer formed over a second end part of the contact layer proximate to the second facet; and
   a third current blocking layer formed over the flat part of the second cladding layer, the third current blocking layer being lower in elevation than the first and second current blocking layers over the ridge mesa.

2. The semiconductor laser structure of claim 1, further comprising:
   a plurality of metal-layers over the first, second, and third current-blocking layers and over the part of the contact layer uncovered by the first and second current-blocking layers.

3. The semiconductor laser structure of claim 2, wherein the first conductive type is P-type, while the second conductive type is N-type.

4. The semiconductor laser structure of claim 2, wherein the first conductive type is N-type, while the second conductive type is P-type.

5. The semiconductor laser structure of claim 1, wherein the first, second, and third current-blocking layers are formed from a material selected from the group consisting of silicon nitride, silicon oxide, titanium oxide and aluminum oxide.

6. The semiconductor laser structure of claim 1, wherein the first, second, and third current-blocking layers are formed to a thickness of from 10 Å to 100,000 Å.

7. A semiconductor laser structure, which comprises:
   a semiconductor substrate of first conductive type, comprising a pair of principal side surfaces including a first surface and a second surface, wherein the first surface and the second surface are disposed opposite and parallel to each other;
   a first cladding layer of first conductive type formed over the substrate, the first cladding layer extending from the first surface to the second surface;
   an active layer formed over the first cladding layer of first conductive type over, the active layer extending from the first surface to the second surface;
   a second cladding layer of second conductive type formed over the active layer, the second cladding layer having a flat part and a ridge mesa over the flat part, and the second cladding layer extending from the first surface to the second surface, wherein the ridge mesa includes a length portion which is longer than a width portion, the length portion extends from the first surface to the second surface;
   the side surfaces including the side surfaces of the first cladding layer, the active layer, and the flat surface of the second cladding layer, along the first surface and the second surface serves as a first facet and a second facet of the semiconductor laser structure respectively;
   a contact layer of second conductive type formed over the ridge over the ridge mesa of the second cladding layer;
   a first current blocking layer formed over a first end part of the ridge mesa proximate to the first facet;
   a second current blocking layer formed over a second end part of the ridge mesa proximate to the second facet, wherein the contact layer is disposed in between the first and second current blocking layers; and
   a third current blocking layer formed over the flat part of the second cladding layer.

8. The semiconductor laser structure of claim 7, further comprising:
   a plurality of metal- layers of second conductive type formed respectively over the first, second, and third current-blocking layers and over the part of the contact layer uncovered by the first and second current-blocking layers.

9. The semiconductor laser structure of claim 8, wherein the first conductive type is P-type, while the second conductive type is N-type.

10. The semiconductor laser structure of claim 8, wherein the first conductive type is N-type, while the second conductive type is P-type.

11. The semiconductor laser structure of claim 7, wherein the first, second, and third current-blocking layers are formed from a material selected form the group consisting of silicon nitride, silicon oxide, titanium oxide and aluminum oxide.

12. The semiconductor laser structure of claim 7, wherein the first, second, and third current-blocking layers are formed to a thickness of from 10 Å to 100,000 Å.

13. A semiconductor laser structure with a pair of principal opposite side surfaces including a first surface and a second surface, comprising a first cladding layer of first conductive type, an active layer disposed on the first cladding layer, a second cladding layer of second conductive type disposed on the active layer, the second cladding layer having a flat part and a ridge mesa located over the flat part, wherein the first cladding layer, the active layer and the second cladding layer are disposed extending from the first surface and the second surface, and wherein the ridge mesa includes a length portion which is longer than a width portion, the length portion extending from the first surface to the second surface, the structure comprising:

a contact layer of second conductive type formed over the ridge over the ridge mesa of the second cladding layer wherein the contact layer includes a length portion which is longer than a width portion, the length portion extends from the first surface to the second surface;

a first current blocking layer disposed over a first end part of the length portion of the contact layer;

a second current blocking layer disposed over a second end part of the length portion of the contact layer; and a third current blocking layer disposed over the flat part of the second cladding layer.

14. A semiconductor laser structure with a pair of principal opposite side surfaces including a first surface and a second surface, comprising a first cladding layer of first conductive type, an active layer disposed on the first cladding layer, a second cladding layer of second conductive type disposed on the active layer, the second cladding layer having a flat part and a ridge mesa over the flat part, wherein the first cladding layer, the active layer and the second cladding layer are disposed extending from the first surface and the second surface, and wherein the ridge mesa includes a length portion which is longer than a width portion, the length portion extending from the first surface to the second surface, the structure further comprising:

a contact layer of second conductive type disposed over a middle portion of the length portion of the ridge mesa of the second cladding layer;

a first current blocking layer disposed over a first end part of the length portion of the ridge mesa of the second cladding layer;

a second current blocking layer disposed over a second end part of the length portion of the ridge mesa of the second cladding layer, wherein the contact layer is disposed in between the first and second current blocking layers; and a third current blocking layer formed over the flat part of the second cladding layer.

* * * * *